United States Patent
Lu et al.

(10) Patent No.: US 10,650,752 B1
(45) Date of Patent: May 12, 2020

(54) TFT PIXEL THRESHOLD VOLTAGE COMPENSATION CIRCUIT WITH SHORT ONE HORIZONTAL TIME

(71) Applicant: Sharp Kabushiki Kaisha, Osaka (JP)

(72) Inventors: Tong Lu, Oxford (GB); Michael James Brownlow, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 16/171,724

(22) Filed: Oct. 26, 2018

(51) Int. Cl.
  *G09G 3/3258* (2016.01)
  *H01L 27/12* (2006.01)
  *G09G 3/3233* (2016.01)

(52) U.S. Cl.
  CPC ......... *G09G 3/3258* (2013.01); *G09G 3/3233* (2013.01); *H01L 27/1214* (2013.01)

(58) Field of Classification Search
  None
  See application file for complete search history.

(56) References Cited

U.S. PATENT DOCUMENTS

| | | | |
|---|---|---|---|
| 7,277,071 B2 | 10/2007 | Oh | |
| 7,317,435 B2 | 1/2008 | Hsueh | |
| 7,414,599 B2 | 8/2008 | Chung et al. | |
| 9,455,311 B2 | 9/2016 | Shishido | |
| 9,773,449 B2 | 9/2017 | Lin et al. | |
| 2012/0306843 A1* | 12/2012 | Wang | G09G 3/3258 345/212 |

* cited by examiner

*Primary Examiner* — Kenneth B Lee, Jr.
(74) *Attorney, Agent, or Firm* — Renner, Otto, Boisselle & Sklar, LLP

(57) ABSTRACT

A pixel circuit for a display device is operable in a compensation phase, a data programming phase, and an emission phase, whereby the one horizontal time is minimized while maintaining accurate compensation of the threshold voltage of the drive transistor. The pixel circuit includes: a storage capacitor having a first plate connected to a third terminal of the drive transistor that receives a voltage input, and a second plate connected to the gate of the drive transistor; and a programming capacitor having a first plate connected to second and third transistors, and a second plate of the programming capacitor is electrically connected to a data voltage input during the data programming phase, wherein the first plate of the programming capacitor is electrically connected to the second plate of the storage capacitor when the second transistor is in an on state. The second plate of the programming capacitor further is electrically connected to a reference voltage input to perform the compensation phase, and the programming capacitor further is electrically isolated from the storage capacitor and the drive transistor by the second and third transistors during the emission phase.

20 Claims, 10 Drawing Sheets

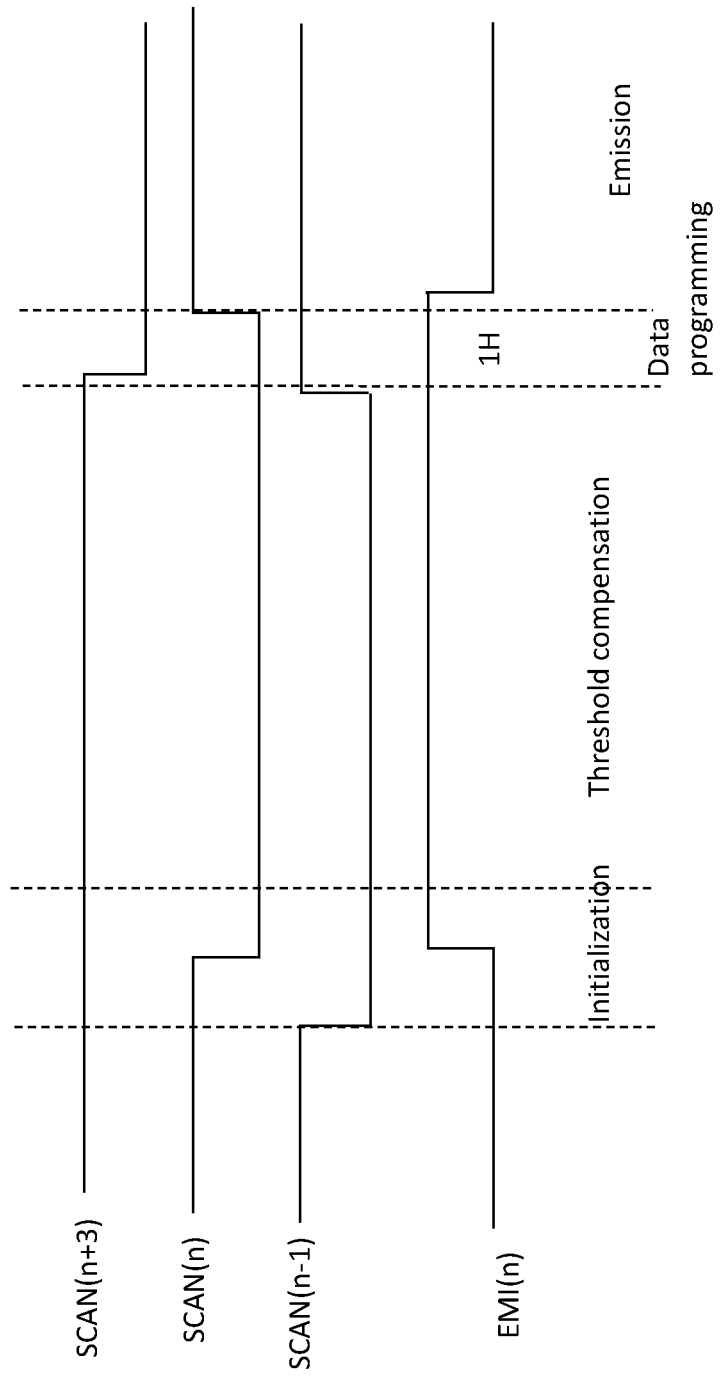

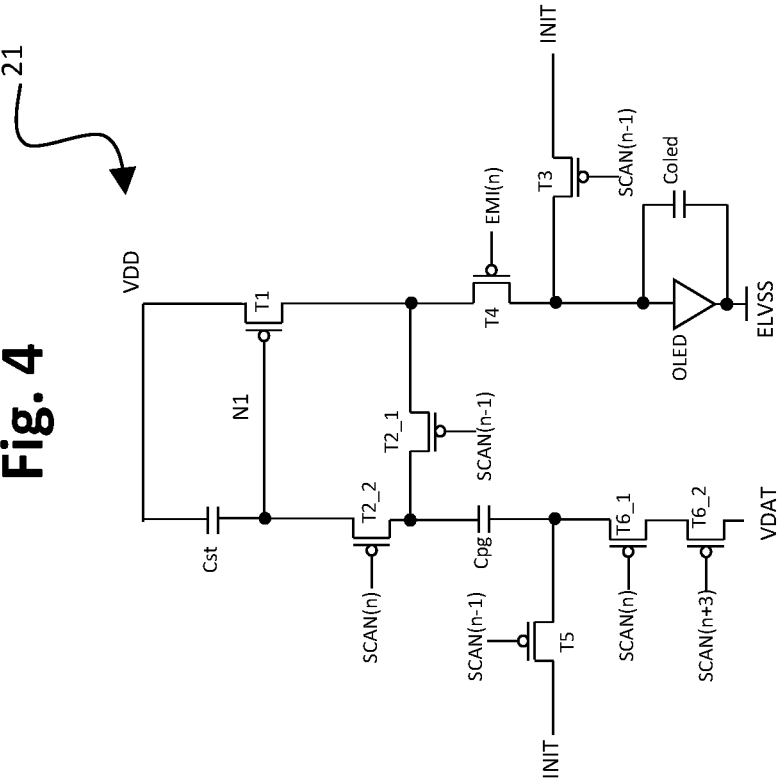
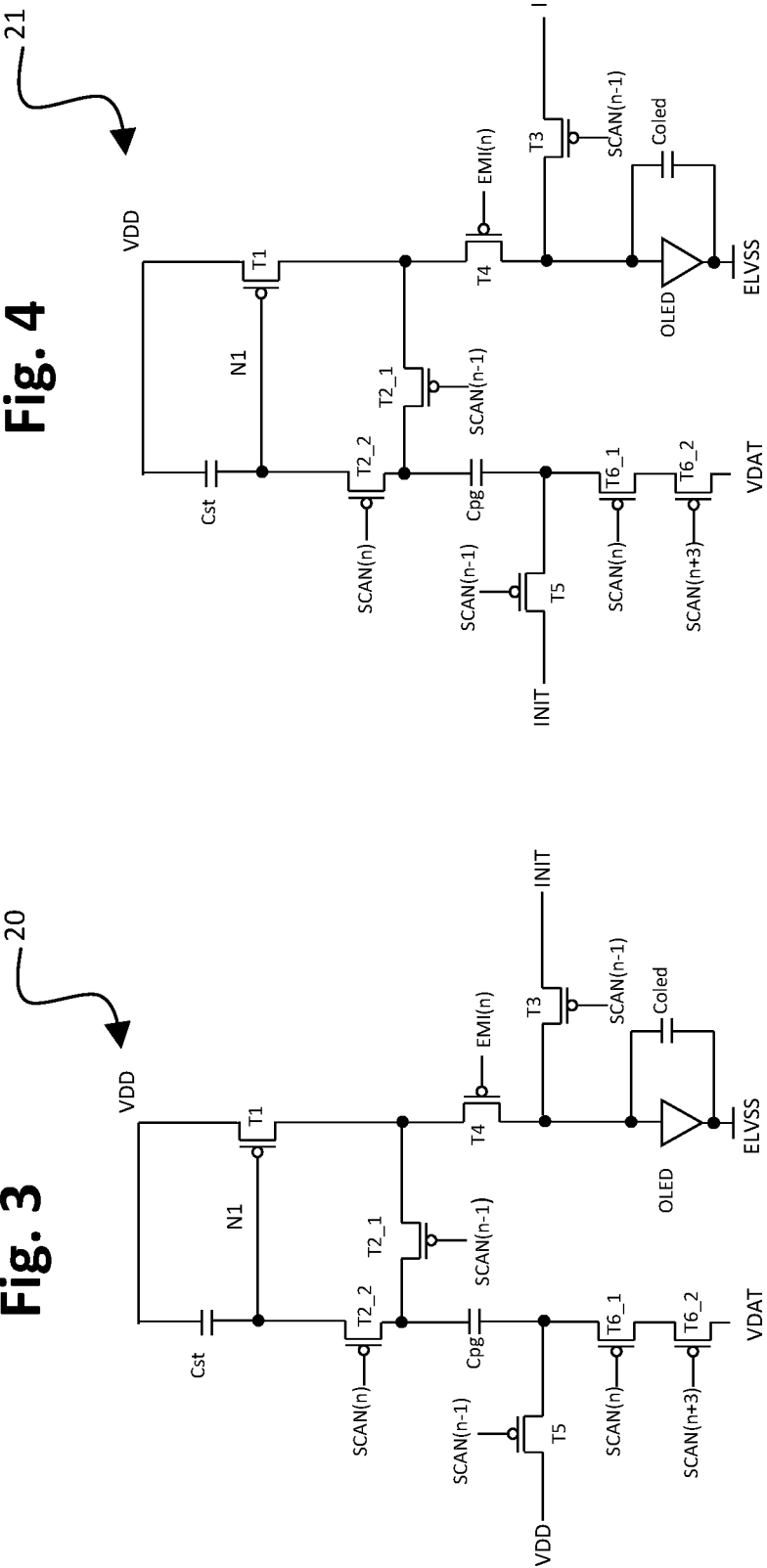

TFT PIXEL THRESHOLD VOLTAGE COMPENSATION CIRCUIT WITH SHORT ONE HORIZONTAL TIME

TECHNICAL FIELD

The present invention relates to design and operation of electronic circuits for delivering electrical current to an element in a display device, such as for example to an organic light-emitting diode (OLED) in the pixel of an active matrix OLED (AMOLED) display device.

BACKGROUND ART

Organic light-emitting diodes (OLED) generate light by re-combination of electrons and holes, and emit light when a bias is applied between the anode and cathode such that an electrical current passes between them. The brightness of the light is related to the amount of the current. If there is no current, there will be no light emission, so OLED technology is a type of technology capable of absolute blacks and achieving almost "infinite" contrast ratio between pixels when used in display applications.

Several approaches are taught in the prior art for pixel thin film transistor (TFT) circuits to deliver current to an element of a display device, such as for example an organic light-emitting diode (OLED), through a drive transistor. In one example, an input signal, such as a high "SCAN" signal, is employed to switch transistors in the circuit to permit a data voltage, VDAT, to be stored at a storage capacitor during a programming phase. When the SCAN signal is low and the switch transistors isolate the circuit from the data voltage, the VDAT voltage is retained by the capacitor and this voltage is applied to a gate of a drive transistor. With the drive transistor having a threshold voltage $V_{TH}$, the amount of current to the OLED is related to the voltage on the gate of the drive transistor by:

$$I_{OLED} = \frac{\beta}{2}(V_{DAT} - V_{OLED} - V_{TH})^2$$

TFT device characteristics, especially the TFT threshold voltage $V_{TH}$, may vary with time or among comparable devices, for example due to manufacturing processes or stress and aging of the TFT device over the course of operation. With the same VDAT voltage, therefore, the amount of current delivered by the drive TFT could vary by a large amount due to such threshold voltage variations. Therefore, pixels in a display may not exhibit uniform brightness for a given VDAT value.

Conventionally, therefore, OLED pixel circuits have high tolerance ranges to variations in threshold voltage and/or carrier mobility of the drive transistor by employing circuits that compensate for mismatch in the properties of the drive transistors. For example, an approach is described in U.S. Pat. No. 7,414,599 (Chung et al., issued Aug. 19, 2008), which describes a circuit in which the drive TFT is configured to be a diode-connected device during a programming period, and a data voltage is applied to the source of the drive transistor.

The threshold compensation time is decided by the drive transistor's characteristics, which may require long compensation time for high compensation accuracy. For the data programming time, the RC constant time required for charging the programming capacitor is determinative of the programming time. As is denoted in the art, the one horizontal (1H) time is the time that it takes for the data to be programmed for one row.

With such circuit configuration as in U.S. Pat. No. 7,414,599, the data is programmed at the same time as when the threshold voltage of the drive transistor is compensated. It is desirable, however, to have as short of a one horizontal time as possible to enhance the responsiveness and operation of the display device. This is because each row must be programmed independently, whereas other operations, such as for example drive transistor compensation, may be performed for multiple rows simultaneously. The responsiveness of the display device, therefore, tends to be dictated most by the one horizontal time for programming. When the data is programmed during the same operational phase as the drive transistor is compensated, the one horizontal time cannot be reduced further due to compensation accuracy requirements for the drive transistor, as the compensation requirements limit any time reductions for the programming phase.

Another approach is described in U.S. Pat. No. 7,277,071 (Choon-Vul Oh, issued Oct. 2, 2007). In such circuit, two capacitors are used, one for storing the programmed data voltage and the other one for storing the threshold voltage of the drive transistor. In this way, the one horizontal time is dictated by the data programming time only, but this scheme does not use the advantage of independent programming time to minimize the one horizontal time. The configuration uses the same scan signal in the consecutive rows for threshold voltage compensation and data programming. Hence, the one horizontal time is still dependent upon the threshold compensation time.

Other approaches to address the above problems have proven deficient. U.S. Pat. No. 7,317,435 (Wei-Chieh Hsueh., issued Jan. 8, 2008) describes a similar scheme of using two capacitors, one for storing the programmed data voltage and the other one for storing the threshold voltage. The data programming time is reduced as compared to the threshold compensation time. The data line, however, also supplies a reference voltage for "Reset" and "Compensation" phases, and the data line thus cannot be used by other rows during the above two phases. Accordingly, the effective one horizontal time is not actually reduced in a meaningful manner over conventional configurations.

U.S. Pat. No. 9,455,311 (Hideaki Shishido, issued Sep. 27, 2016) describes a scheme with a longer threshold compensation time and a shorter data programming phase performed at the end of the threshold compensation phase. Hence, a shorter one horizontal time is achieved. A disadvantage of this scheme, however, is that when data is programmed, the programming operation can disturb the compensated threshold voltage and compromise the accuracy of threshold compensation. U.S. Pat. No. 9,773,449 (Yung-Ming Lin, issued Sep. 26, 2017) describes a similar scheme by which data is programmed after threshold voltage compensation. The data programming does not disturb the threshold compensation, but a disadvantage of this scheme is that the terminal of the capacitor for data programming is floating during the emission phase. The noise from the data line could couple to the programming capacitor, so the gate voltage of the drive transistor could be affected by this noise during the emission phase. Hence, the OLED current could be disturbed by the noise from the data line.

SUMMARY OF INVENTION

The present invention relates to pixel circuits that are capable of compensating the threshold voltage variations of the drive transistor with an ultra-short one horizontal time 1H of less than about 2 µs, which is shorter as compared to conventional configurations, with additionally removing the possible memory effects associated with the OLED device and drive transistor from the previous frame.

An ultra-short 1H (<2 µs) is achieved via separation of threshold compensation of the drive transistor and data programming phases. The threshold compensation time is dictated by the drive transistor characteristics and is difficult to reduce further without degrading the compensation accuracy. By separating the threshold compensation and data programming phases, a longer time can be allocated to threshold compensation for compensation accuracy. As referenced above, the RC constant time required for charging the programming capacitor is determinative of the programming time, and such programming time can be reduced to ultra-short 1H (<2 µs).

To achieve such results, a two-capacitor structure is used for the threshold compensation and the data programming. Two capacitors, including a storage capacitor $C_{st}$ and a programming capacitor $C_{pg}$, are used for threshold compensation. After the threshold has been compensated, data programming is performed as a separate phase independent of the compensation phase. The data voltage applied at the gate of the drive transistor is scaled by the capacitor ratio $$\frac{C_{pg}}{C_{st}+C_{pg}}.$$

Considering the parasitic capacitance as negligible, the voltage applied at the gate of the drive transistor after threshold compensation and data programming will be the sum of the compensated threshold voltage plus the scaled data voltage and initialization voltage offset.

The data programming time is independent of the threshold compensation time, and thus the 1H time is only dependant on the data programming time. Accordingly, a short 1H time can be achieved. An isolation switch transistor is also put between the two capacitors, which isolates the programming capacitor $C_{pg}$ from the storage capacitor during the emission phase. In this manner, the noise that otherwise may couple from the programming capacitor $C_{pg}$ is isolated from the storage capacitor $C_{st}$, and in turn the OLED.

An aspect of the invention, therefore, is a pixel circuit for a display device operable in a compensation phase, a data programming phase, and an emission phase, whereby the one horizontal time is minimized while maintaining accurate compensation of the threshold voltage of the drive transistor. In exemplary embodiments, the pixel circuit includes: a drive transistor configured to control an amount of current to a light-emitting device during the emission phase depending upon a voltage input applied to a gate of the drive transistor; a second transistor and a third transistor, wherein the second transistor is connected between the gate of the drive transistor and the third transistor, and the third transistor is connected between the second transistor and a second terminal of the drive transistor, such that when the second and third transistors are in an on state the drive transistor becomes diode-connected such that the gate and the second terminal of the drive transistor are electrically connected through the second and third transistors, wherein a threshold voltage of the drive transistor is compensated during the compensation phase while the drive transistor is diode connected. The light-emitting device is electrically connected at a first node to the second terminal of the drive transistor during the emission phase and at a second node to a first voltage input. The pixel circuit further includes a storage capacitor having a first plate connected to a third terminal of the drive transistor that receives a second voltage input, and a second plate connected to the gate of the drive transistor, and a programming capacitor having a first plate connected to the third second and third transistors, and a second plate of the programming capacitor is electrically connected to a data voltage input during the data programming phase, wherein the first plate of the programming capacitor is electrically connected to the second plate of the storage capacitor when the second transistor is in an on state. The second plate of the programming capacitor further is electrically connected to a reference voltage input to perform the compensation phase, and the programming capacitor further is electrically isolated from the storage capacitor and the drive transistor by the second and third transistors during the emission phase.

Another aspect of the invention is a method of operating a pixel circuit according to any of the embodiments, whereby the one horizontal time is minimized while maintaining accurate compensation of the threshold voltage of the drive transistor. In exemplary embodiments, the method of operating includes the steps of providing a pixel circuit according to any of the embodiments; performing a compensation phase to compensate a threshold voltage of the drive transistor comprising diode-connecting the drive transistor through the second and third transistors and applying the reference voltage at the second plate of the programming capacitor while the drive transistor is diode connected, wherein the programming capacitor is isolated from the reference voltage at the end of the compensation phase; performing a data programming phase to program the data voltage to the programming capacitor comprising applying the data voltage at a second plate of the programming capacitor; and performing an emission phase during which light is emitted from the light-emitting device comprising isolating the programming capacitor from the storage capacitor and the drive transistor, and applying the second voltage input through the drive transistor to the light emitting device. The programming phase follows the threshold compensation phase, and a duration of the data programming phase is shorter than a duration of the compensation phase.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 2 is a drawing depicting a timing diagram associated with the operation of the circuit of FIG. 1.

FIG. 3 is a drawing depicting a second circuit configuration in accordance with embodiments of the present invention.

FIG. 4 is a drawing depicting a third circuit configuration in accordance with embodiments of the present invention.

DESCRIPTION OF EMBODIMENTS

Figure 1:
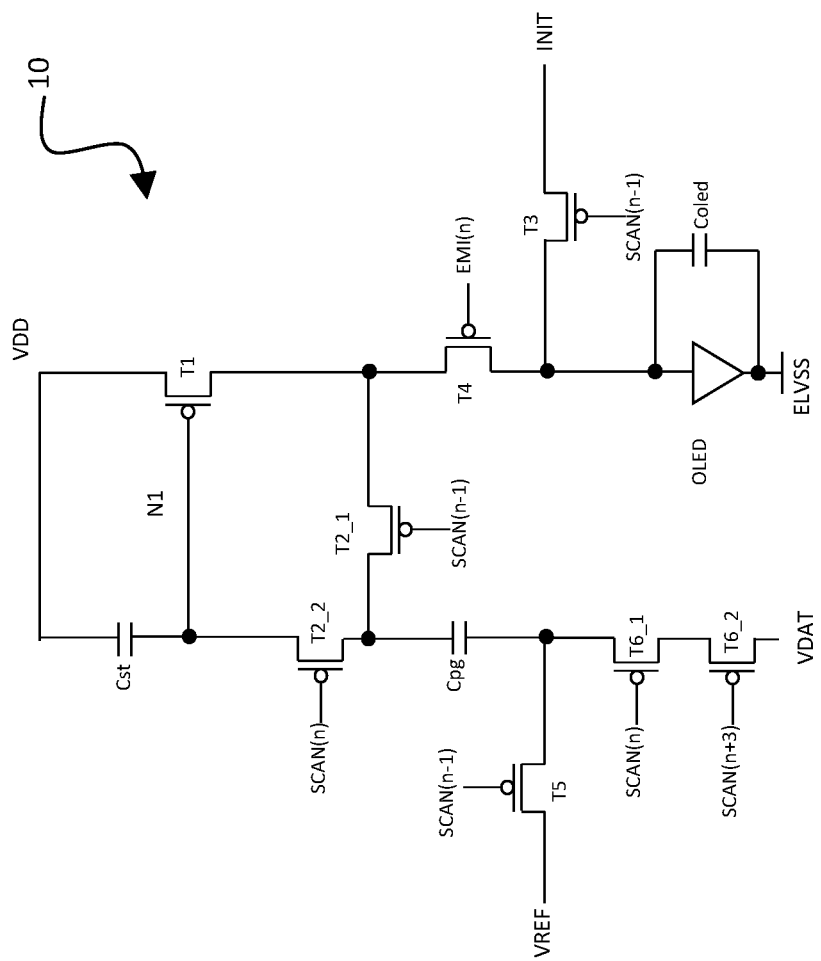
FIG. 1 is a drawing depicting a first circuit configuration in accordance with embodiments of the present invention.

Embodiments of the present invention will now be described with reference to the drawings, wherein like reference numerals are used to refer to like elements throughout. It will be understood that the figures are not necessarily to scale.

FIG. 1 is a drawing depicting a first circuit configuration 10 in accordance with embodiments of the present invention, and FIG. 2 is a timing diagram associated with the operation of the circuit configuration 10 of FIG. 1. In this example, the circuit 10 is configured as a TFT circuit that includes multiple p-type transistors T1-T6_2 and two capacitors including a storage capacitor $C_{st}$ and a programming capacitor $C_{pg}$. The circuit elements drive a light-emitting device, such as for example an OLED. The light-emitting device (OLED) has an associated internal capacitance, which is represented in the circuit diagram as $C_{oled}$. In addition, although the embodiments are described principally in connection with an OLED as the light-emitting device, comparable principles may be used with display technologies that employ other types of light-emitting devices, including for example micro LEDs and quantum dot LEDs.

More specifically, FIG. 1 depicts the TFT circuit 10 configured with multiple p-MOS or p-type TFTs. T1 is a drive transistor that is an analogue TFT, and T2-T6_2 are digital switch TFTs. As referenced above, $C_{st}$ and $C_{pg}$ are capacitors, and $C_{oled}$ is the internal capacitance of the OLED device (i.e., $C_{oled}$ is not a separate component, but is inherent to the OLED). The OLED further is connected to a first power supply ELVSS as is conventional.

The OLED and the TFT circuit 10, including the transistors, capacitors and connecting wires, may be fabricated using TFT fabrication processes conventional in the art. It will be appreciated that comparable fabrication processes may be employed to fabricate the TFT circuits according to any of the embodiments.

For example, the TFT circuit 10 (and subsequent embodiments) may be disposed on a substrate such as a glass, plastic, or metal substrate. Each TFT may comprise a gate electrode, a gate insulating layer, a semiconducting layer, a first electrode, and a second electrode. The semiconducting layer is disposed on the substrate. The gate insulating layer is disposed on the semiconducting layer, and the gate electrode may be disposed on the insulating layer. The first electrode and second electrode may be disposed on the insulating layer and connected to the semiconducting layer using vias. The first electrode and second electrode respectively may commonly be referred to as the "source electrode" and "drain electrode" of the TFT. The capacitors may comprise a first electrode, an insulating layer and a second electrode, whereby the insulating layer forms an insulating barrier between the first and second electrodes. Wiring between components in the circuit, and wiring used to introduce signals to the circuit (e.g. SCAN, EMI, VDATA, INIT) may comprise metal lines or a doped semiconductor material. For example, metal lines may be disposed between the substrate and the gate electrode of a TFT, and connected to electrodes using vias. The semiconductor layer may be deposited by chemical vapour deposition, and metal layers may be deposited by a thermal evaporation technique.

The OLED device may be disposed over the TFT circuit. The OLED device may comprise a first electrode (e.g. anode of the OLED), which is connected to transistors T3 and T4 in this example, one or more layers for injecting or transporting charge (e.g. holes) to an emission layer, an emission layer, one or more layers for injecting or transporting electrical charge (e.g. electrons) to the emission layer, and a second electrode (e.g. cathode of the OLED), which is connected to first power supply ELVSS in this example. The injection layers, transport layers and emission layer may be organic materials, the first and second electrodes may be metals, and all of these layers may be deposited by a thermal evaporation technique.

Referring to the TFT circuit 10 in combination with the timing diagram, the TFT circuit 10 operates to perform in four phases: an initialization phase, a threshold compensation phase, a data programming phase and an emission phase for light emission. The time period for performing the programming phase is referred to in the art as the "one horizontal time" or "1H" as illustrated in timing diagram and subsequent the timing diagrams. A short 1H time is a requirement for displays with a large number of pixels in a column, as is necessary for high-resolution displays. As referenced above, a short one horizontal time is significant because each row must be programmed independently, whereas other operations, such as for example drive transistor threshold compensation, may be performed for multiple rows simultaneously. The responsiveness of the device, therefore, tends to be dictated most by the one horizontal time for programming.

Generally, this embodiment has comparable control signals EMI and SCAN for other rows of pixels in the device, thereby enabling fewer control signal wires in a display configuration. For this example and in subsequent embodiments, display pixels are addressed by row and column. The current row is row n. The previous row is row n−1, and the second previous row is row n−2. The next row is row n+1, and the row after that is row n+2, and so on for the various rows as they relate to the corresponding control signals identified in the figures. Accordingly, for example, SCAN(n) refers to the scan signal at row n and SCAN(n+1) refers to the scan signal at row n+1, and the like. EMI(n) refers to the emission signal at row n and EMI(n−1) refers to the emission signal at row n−1, and the like, and so on for the various control signals. In this manner, for the various embodiments the input signals correspond to the indicated rows, and thus input signals may be shared by different rows.

In this first embodiment, during the previous emission phase, the EMI(n) signal level has a low voltage value, so transistor T4 is on, and light emission is being driven by the input driving voltage VDD connected to the drive transistor T1, whereby the actual current applied to the OLED is determined by the voltage at the gate of the drive transistor. The SCAN signal levels initially have a high voltage value so transistors T2_1 and T2_2, T3, T5 and T6_1 and T6_2 are off. Next at the beginning of the initialization phase, the SCAN (n−1) signal level is changed from a high voltage value to a low voltage value, causing transistors T3, T2_1 and T5 to be turned on. With transistor T3 turning on, an initialization voltage, INIT, is applied at the anode of the OLED. The INIT voltage is set to lower than the threshold voltage of the OLED, and thus the INIT voltage does not cause light emission when applied at the anode of the OLED. With transistor T2_1 turning on, the initialization voltage, INIT, is also applied at the top plate of the programming capacitor, $C_{pg}$. The application of the initialization voltage in the various embodiments operates to clear memory effects from the previous frame. With transistor T5 turning on, the reference voltage VREF is applied at the bottom plate of the programming capacitor, $C_{pg}$, and the charge on the capacitor, $C_{pg}$, is initialized and reset. The application of the initialization voltage in the various embodiments operates to clear memory effects from the previous frame.

Next during the initialization phase, the SCAN (n) signal level is changed from a high voltage value to a low voltage value, causing transistors T2_2 and T6_1 to be turned on. With transistor T2_2 turning on, the bottom plate of the storage capacitor, $C_{st}$, and thus also the gate of the drive transistor (node N1), is connected to the INIT voltage through transistors T3, T4, T2_1 and T2_2. The node N1 is initialized to the initialization voltage, INIT. Consequently, the drive transistor T1 is "diode-connected" through transistors T2_1 and T2_2. Diode-connected refers to the drive transistor T1 being operated with its gate and a second terminal (e.g., source or drain) being electrically connected, such that current flows in one direction. The transistor T6_1 is turned on and ready for the data programming phase.

The TFT circuit 10 next is operable in a threshold compensation phase, during which the threshold voltage of the drive transistor T1 is compensated. For such phase, the EMI(n) signal level is changed from a low voltage value to a high voltage value, causing transistor T4 to be turned off. The drain and gate of the diode-connected transistor T1, the bottom plate of the storage capacitor, $C_{st}$, and the top plate of the capacitor, $C_{pg}$, thus are disconnected from the anode of the OLED, thereby electrically isolating the OLED.

Preferably, to have effective threshold voltage compensation of the drive transistor T1, the voltage at the gate of the drive transistor should satisfy the following condition:

$$V_{DD}-V_{N1}>|V_{TH}|+\Delta V,$$

where $V_{N1}$ is the gate voltage of the drive transistor T1; $V_{TH}$ is the threshold voltage of the drive transistor T1, and $\Delta V$ is a voltage that is large enough to generate a high initial current to charge the storage capacitor within allocated threshold compensation time. The value of $\Delta V$ will depend on the properties of the transistors. For example, $\Delta V$ would be at least 3 volts for exemplary low-temperature polycrystalline silicon thin film transistor processes. The initial voltage, INIT, is set to satisfy the gate voltage, $V_{N1}$ requirement.

At the end of the threshold compensation phase, the SCAN (n−1) signal level is changed from the low voltage value to the high voltage value, causing transistors T2_1, T3 and T5 to be turned off. With T2_1 turning off, the drive transistor is no longer diode-connected. The voltage at the gate of the drive transistor is $V_{DD}-|V_{TH}|$. With T3 turning off, the INIT voltage is disconnected from the anode of the OLED. With T5 tuning off, the reference voltage VREF is disconnected with the bottom plate of the capacitor, $C_{pg}$.

The TFT circuit 10 next is operable in a data programming phase. The SCAN (n+3) signal level is changed from the high voltage value to the low voltage value, causing transistor T6_2 to be turned on. The data signal thus is applied at the bottom plate of the data programming capacitor, $C_{pg}$. The data voltage, VDAT, is changed from the value for another pixel (e.g. the previous row of the display DATA(n−1)) to the data value for the current pixel (e.g. the current row of the display DATA(n)). Considering that the parasitic capacitance is negligible, the data voltage VDAT is applied at the bottom plate of the programming capacitor, $C_{pg}$. The charge change at the said bottom plate is $(V_{DAT}-V_{REF})C_{pg}$. The same amount charge change will appear on the top plate of the programming capacitor, $C_{pg}$, and thus the node N1. As both the capacitors, $C_{pg}$ and $C_{st}$, are connected at the node N1, the voltage change due the applied data voltage is $$\frac{C_{pg}}{C_{pg}+C_{st}}(V_{DAT}-V_{REF}).$$

Next the SCAN (n) signal level is changed from the low voltage value to the high voltage value, causing transistor T2_2, T6_1 to be turned off. The capacitor, $C_{pg}$, is disconnected from node N1 and the data line, and thus any noise from the data line, is isolated from the gate of the drive transistor. The gate voltage of the drive transistor is at the end of the data programming phase is $$V_{DD}-|V_{TH}|+\frac{C_{pg}}{C_{pg}+C_{st}}(V_{DAT}-V_{REF}).$$

For the programming phase, SCAN signals applied to different rows (e.g., SCAN(n) and SCAN(n+3)) are employed to electrically connect the data voltage VDAT to the bottom plate of the programming capacitor $C_{pg}$. By using SCAN signals from different rows in combination, a short programming pulse results from overlap of the SCAN signals, thereby minimizing the 1H time as shown in the timing diagram of FIG. 2. Although in this embodiment, the SCAN (n) and SCAN (n+3) are used to control the switch transistors T6_1 and T6_2 to generate the short programming pulse, the SCAN signals from other rows can be used. The generated short programming pulse can be applied any time after the threshold compensation phase and before the emission phase. This embodiment has an advantage of using existing SCAN signal lines, but requires the two transistors T6_1 and T6_2 to connect VDAT to the programming capacitor $C_{pg}$ during the programming phase.

As referenced above and as illustrated in the timing diagram, the SCAN(n) signal is taken to a high voltage at the end of the programming phase, which turns off T2_2. At this time, SCAN(n−1) is also a high voltage, meaning T2_1 is also off. The result is that the programming capacitor $C_{pg}$ is in a floating state whereby $C_{pg}$ is electrically isolated from the storage capacitor Cst, and in turn the drive transistor and the OLED for the subsequent emission phase. With such isolation of the programming capacitor from the storage capacitor and the other circuit elements, any noise from the data line is not coupled to the drive transistor and OLED. In manner, the circuit configuration has several advantages. The programming and compensation phases are independent of each other, which provides for a shortened one horizontal time as compared to conventional configurations. Said independence also maintains accurate threshold compensation, and the isolation of the programming capacitor during the emission phase prevents any coupling of noise from the data line.

The TFT circuit 10 next is operable in an emission phase during which the OLED is capable of emitting light with a driving voltage input being supplied from VDD through T4. The EMI(n) signal is changed from the high voltage value to the low voltage value, causing transistor T4 to be turned on. With transistor T4 turning on, the drain of the drive transistor is connected to the anode of the OLED. The current that flows through the OLED is $$I_{OLED} = \frac{\beta}{2}\left(V_{DD} - |V_{TH}| + \frac{C_{pg}}{C_{pg} + C_{st}}(V_{DAT} - V_{DD}) - V_{DD} - V_{TH}\right)^2 =$$

$$\frac{\beta}{2}\left(\frac{C_{pg}(V_{DAT} - V_{REF})}{C_{pg} + C_{st}}\right)^2$$

where $\beta = \mu_n \cdot C_{ox} \cdot W/L$,
$C_{ox}$ is the capacitance of the drive transistor gate oxide;
W is the width of the drive transistor channel;
L is the length of the drive transistor channel (i.e. distance between source and drain);
$\mu_n$ is the carrier mobility of the drive transistor.

Accordingly, the current to the OLED does not depend on the threshold voltage of the drive transistor T1, and hence the current to the OLED device $I_{OLED}$ is not affected by the threshold voltage variations of the drive transistor. In this manner, variation in the threshold voltage of the drive transistor has been compensated.

FIG. 3 is a drawing depicting a second circuit configuration 20, and FIG. 4 is a drawing depicting a third circuit configuration 21, in accordance with embodiments of the present invention. The timing and the operation method of the circuit configurations 20 and 21 is essentially the same as the first circuit configuration 10, with the circuit configurations 20 and 21 varying as to a portion of the voltage supply inputs. In particular, the bottom plate of the programming capacitor, $C_{pg}$, is connected to an existing voltage supply, either supply voltage VDD in the circuit configuration 20 of FIG. 3, or the initialization voltage INIT in the circuit configuration 21 of FIG. 4, instead of a separate reference voltage, VREF, as done in the circuit configuration of FIG. 1. In the embodiments of FIGS. 3 and 4, therefore, an existing voltage input line supplies the reference voltage, or the reference voltage is the same as either VDD (FIG. 3) or INIT (FIG. 4). In this manner, the number of the input signal lines connected to the pixel circuit is reduced, and in turn the area of the pixel is reduced which is advantageous for high-definition displays. By comparison, an advantage of the circuit configuration 10 of FIG. 1, having an independent reference voltage input, is that within a defined or optimized data voltage range, the reference voltage can be selected as not being limited by an existing voltage supply.

For the circuit configuration 20 of FIG. 3, the current that flows through the OLED during emission phase is $$I_{OLED} = \frac{\beta}{2}\left(\frac{C_{pg}(V_{DAT} - V_{DD})}{C_{pg} + C_{st}}\right)^2.$$

For the circuit configuration 21 of FIG. 4, the that current flows through the OLED during emission phase is $$I_{OLED} = \frac{\beta}{2}\left(\frac{C_{pg}(V_{DAT} - V_{INIT})}{C_{pg} + C_{st}}\right)^2.$$

For the defined output current range, the data voltage, $V_{DAT}$, range has to be adjusted depending upon which voltage is utilized as the reference voltage—VDD, INIT, or an independent VREF.

Figure 5:
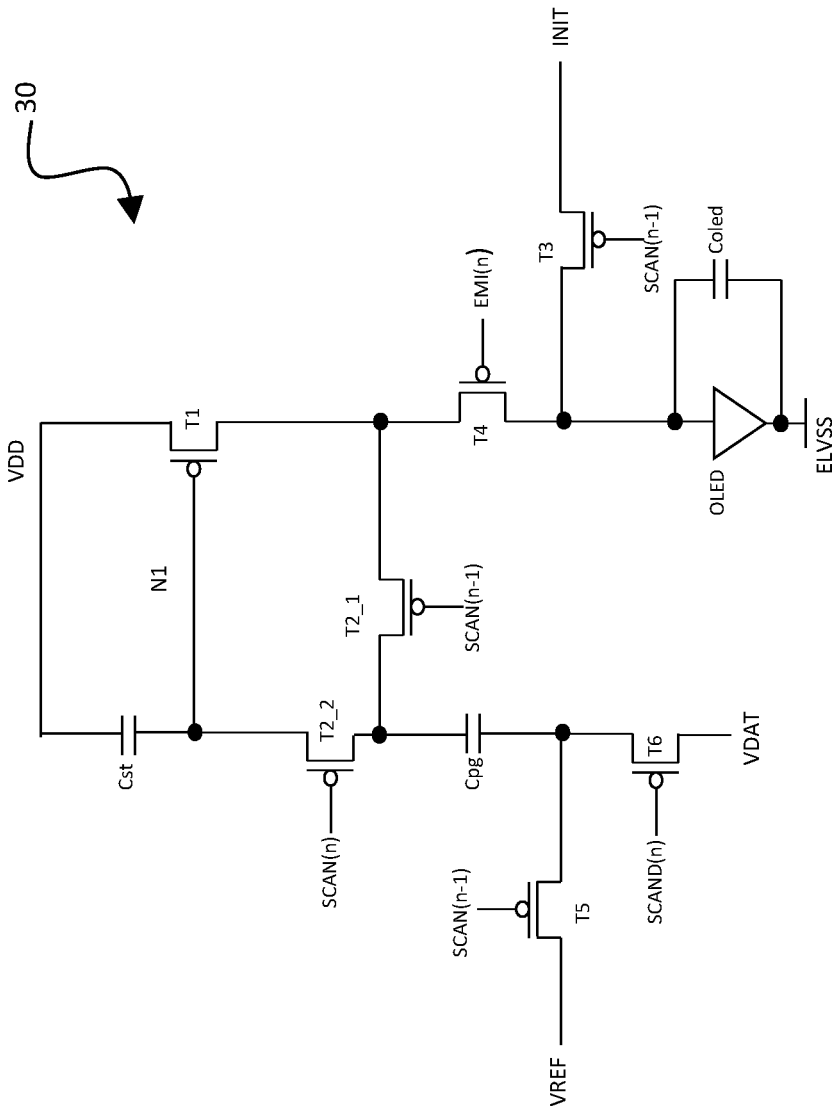
FIG. 5 is a drawing depicting a fourth circuit configuration in accordance with embodiments of the present invention.
Figure 6:
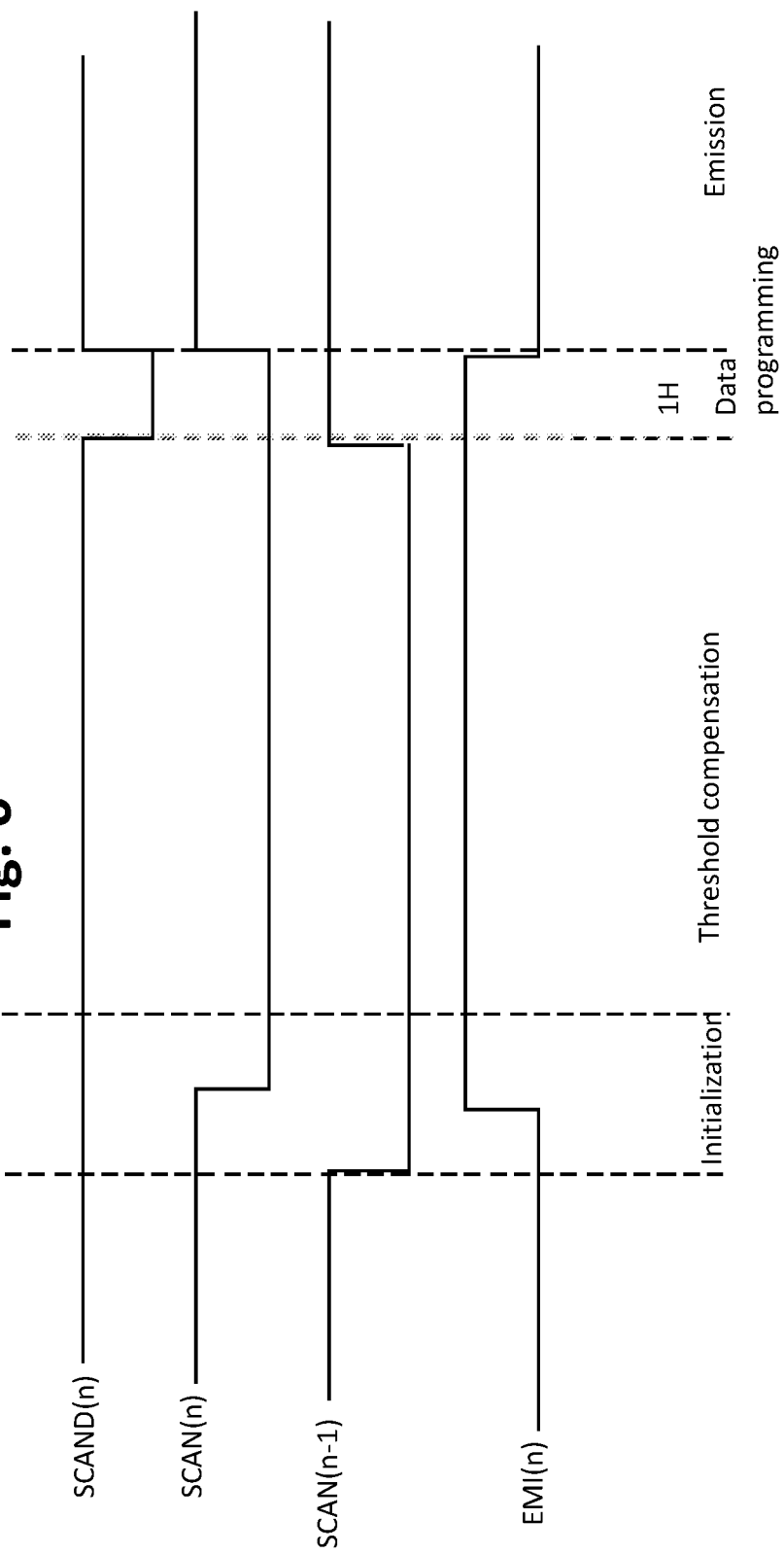
FIG. 6 is a drawing depicting a timing diagram associated with the operation of the circuit of FIG. 5.

FIG. 5 is a drawing depicting a fourth circuit configuration 30 in accordance with embodiments of the present invention, and FIG. 6 is a timing diagram associated with the operation of the circuit configuration 30 of FIG. 5. In this example, similarly as in the previous embodiments, the circuit 30 is configured as a TFT circuit that includes multiple p-type transistors (T1-T6). T1 is a drive transistor that is an analogue p-type TFT, and T2-T6 are p-type digital switch TFTs. In this embodiment, there again are two capacitors, including the storage capacitor $C_{st}$ and the programming capacitor $C_{pg}$. The circuit elements drive a light-emitting device, such as for example an OLED. The light-emitting device (OLED) has an associated internal capacitance, which again is represented in the circuit diagram as $C_{oled}$. The OLED further is connected to the first power supply ELVSS as is conventional. In addition, although the embodiments are described principally in connection with an OLED as the light-emitting device, comparable principles may be used with display technologies that employ other types of light-emitting devices, including for example micro LEDs and quantum dot LEDs.

Referring to the TFT circuit 30 of FIG. 5 in combination with the timing diagram of FIG. 6, the TFT circuit 30 also operates to perform in four phases: an initialization phase, a compensation phase, a data programming phase and an emission phase for light emission.

In this embodiment, during the previous emission phase, the EMI(n) signal level has a low voltage value, so transistor T4 is on, and light emission is being driven by the input driving voltage VDD connected to the drive transistor T1, whereby the actual current applied to the OLED is determined by the voltage at the gate of the drive transistor. The various SCAN signal levels initially have a high voltage value so transistors T2_1, T2_2, T3, T5 and T6 are off. Next at the beginning of the initialization phase, the SCAN (n−1) signal level is changed from the high voltage value to the low voltage value, causing transistors T3, T2_1 and T5 to be turned on. With transistor T3 turning on, an initialization voltage, INIT, is applied at the anode of the OLED. The INIT voltage is set to lower than the threshold voltage of the OLED, and thus the INIT voltage does not cause light emission when applied at anode of the OLED. With transistor T2_1 turning on, the initialization voltage, INIT, is also applied at the top plate of the capacitor, $C_{pg}$. With transistor T5 turning on, the reference voltage VREF is applied at the bottom plate of the capacitor, $C_{pg}$, and the charge on the capacitor, $C_{pg}$, is initialized and reset.

Next during the initialization phase, the SCAN (n) signal level is changed from a high voltage value to a low voltage value, causing transistor T2_2 to be turned on. With transistor T2_2 turning on, the bottom plate of the storage capacitor, $C_{st}$, and thus also the gate of the drive transistor (node N1), is connected to the INIT voltage through transistors T3, T4, T2_1 and T2_2. The node N1 is initialized to the initialization voltage, INIT. Consequently, the drive transistor T1 is diode-connected through transistors T2_1 and T2_2 such that the drive transistor T1 is operated with its gate and a second terminal (e.g., source or drain) being electrically connected.

The TFT circuit 30 next is operable in a threshold compensation phase, during which the threshold voltage of the drive transistor T1 is compensated. For such phase, the EMI(n) signal level is changed from a low voltage value to a high voltage value, causing transistor T4 to be turned off. The drain and gate of the diode-connected transistor T1, the bottom plate of the storage capacitor, $C_{st}$, the top plate of the capacitor, $C_{pg}$, thus are disconnected from the anode of the OLED, thereby electrically isolating the OLED.

Preferably, to have effective threshold voltage compensation of the drive transistor T1, the voltage at the gate of the drive transistor should satisfy the following condition:

$$V_{DD} - V_{N1} > |V_{TH}| + \Delta V,$$

where $V_{N1}$ is the gate voltage of the drive transistor T1; $V_{TH}$ is the threshold voltage of the drive transistor T1, and $\Delta V$ is a voltage that is large enough to generate a high initial current to charge the storage capacitor within an allocated threshold compensation time. The value of $\Delta V$ will depend on the properties of the transistors. For example, $\Delta V$ would be at least 3 volts for exemplary low-temperature polycrystalline silicon thin film transistor processes. The initial voltage, INIT, is set to satisfy the gate voltage, $V_{N1}$ requirement.

At the end of the threshold compensation phase, the SCAN (n−1) signal level is changed from the low voltage value to the high voltage value, causing transistors T2_1, T3 and T5 to be turned off. With T2_1 turning off, the drive transistor is no longer diode-connected. The voltage at the gate of the drive transistor is $V_{DD} - |V_{TH}|$. With T3 turning off, the INIT voltage is disconnected with the anode of the OLED. With T5 tuning off, the reference voltage VREF is disconnected with the bottom plate of the capacitor, $C_{pg}$.

The TFT circuit 30 next is operable in a data programming phase. The SCAND (n) signal level is changed from the high voltage value to the low voltage value, causing transistor T6 to be turned on. The data signal thus is applied at the bottom plate of the data programming capacitor, $C_{pg}$. The data voltage, VDAT, is changed from the value for another pixel (e.g. the previous row of the display DATA (n−1)) to the data value for the current pixel (e.g. the current row of the display DATA(n)). Considering the parasitic capacitance is negligible, the VDAT is applied at the bottom plate of the capacitor, $C_{pg}$. The charge change at said bottom plate is $(V_{DAT} - V_{REF})C_{pg}$. The same amount charge change will appear on the top plate of the capacitor, $C_{pg}$, and thus the node N1. As both the capacitors, $C_{pg}$ and $C_{st}$, are connected the node N1, the voltage change due the applied data voltage is $$\frac{C_{pg}}{C_{pg} + C_{st}}(V_{DAT} - V_{REF}).$$

Next the SCAND (n) signal level is changed from the low voltage value to the high voltage value, causing transistor T6 to be turned off. The capacitor, $C_{pg}$, is disconnected from the data line. Then the SCAN (n) signal level is changed from the low voltage value to the high voltage value, causing transistor T2_2 to be turned off. The capacitor, $C_{pg}$, is disconnected from node N1, and any noise from the data line is isolated from the gate of the drive transistor by transistors T6 and T2_1 being off. The gate voltage of the drive transistor is at the end of the data programming phase is $$V_{DD} - |V_{TH}| + \frac{C_{pg}}{C_{pg} + C_{st}}(V_{DAT} - V_{REF}).$$

The circuit configuration 30 of the embodiment of FIG. 5 differs from the circuit configuration 10 of the embodiment in FIG. 1 with respect to performance of the programming phase. For the programming phase in the circuit configuration 30, a dedicated signal line—SCAND—is applied at the gate of the transistor T6 to electrically connect the data voltage VDAT to the bottom plate of the programming capacitor $C_{pg}$. By using a dedicated SCAND signal line, a short pulse is readily achieved to minimize the one horizontal time 1H as shown in the timing diagram of FIG. 6, rather than relying on overlapping SCAN signals from different rows in combination as performed in the previous embodiment. The embodiment of FIG. 5 has an advantage of using only a single transistor (T6) to electrically connect VDAT to the programming capacitor $C_{pg}$, but requires the additional dedicated SCAND line to perform the programming phase.

Similarly as in the previous embodiment as and as illustrated in the timing diagram, the SCAN(n) signal is taken to a high voltage at the end of the programming phase, which turns off T2_2. At this time, SCAN(n−1) is also a high voltage, meaning T2_1 is also off. The result is that the programming capacitor $C_{pg}$ again is in a floating state whereby $C_{pg}$ is electrically isolated from the storage capacitor Cst, and in turn the drive transistor and the OLED for the subsequent emission phase. With such isolation of the programming capacitor from the storage capacitor and the other circuit elements, any noise from the data line is not coupled to the drive transistor and OLED. Once again, the programming and compensation phases are independent of each other, which provides for a shortened one horizontal time while maintaining accurate threshold compensation, and the isolation of the programming capacitor during the emission phase prevents any coupling of noise from the data line.

The TFT circuit 30 next is operable in an emission phase during which the OLED is capable of emitting light with a driving voltage input being supplied from VDD through T4. The EMI(n) signal is changed from the high voltage value to the low voltage value, causing transistor T4 to be turned on. With transistor T4 turning on, the drain of the drive transistor is connected to the anode of the OLED. The current that flows through the OLED is $$I_{OLED} = \frac{\beta}{2}\left(V_{DD} - |V_{TH}| + \frac{C_{pg}}{C_{pg} + C_{st}}(V_{DAT} - V_{DD}) - V_{DD} - V_{TH}\right)^2 =$$

$$\frac{\beta}{2}\left(\frac{C_{pg}(V_{DAT} - V_{REF})}{C_{pg} + C_{st}}\right)^2$$

where $\beta = \mu_n \cdot C_{ox} \cdot W/L$,
$C_{ox}$ is the capacitance of the drive transistor gate oxide;
W is the width of the drive transistor channel;
L is the length of the drive transistor channel (i.e. distance between source and drain);
$\mu_n$ is the carrier mobility of the drive transistor.

Accordingly, the current to the OLED does not depend on the threshold voltage of the drive transistor T1, and hence the current to the OLED device $I_{OLED}$ is not affected by the threshold voltage variations of the drive transistor. In this manner, variation in the threshold voltage of the drive transistor has been compensated.

Figure 7:
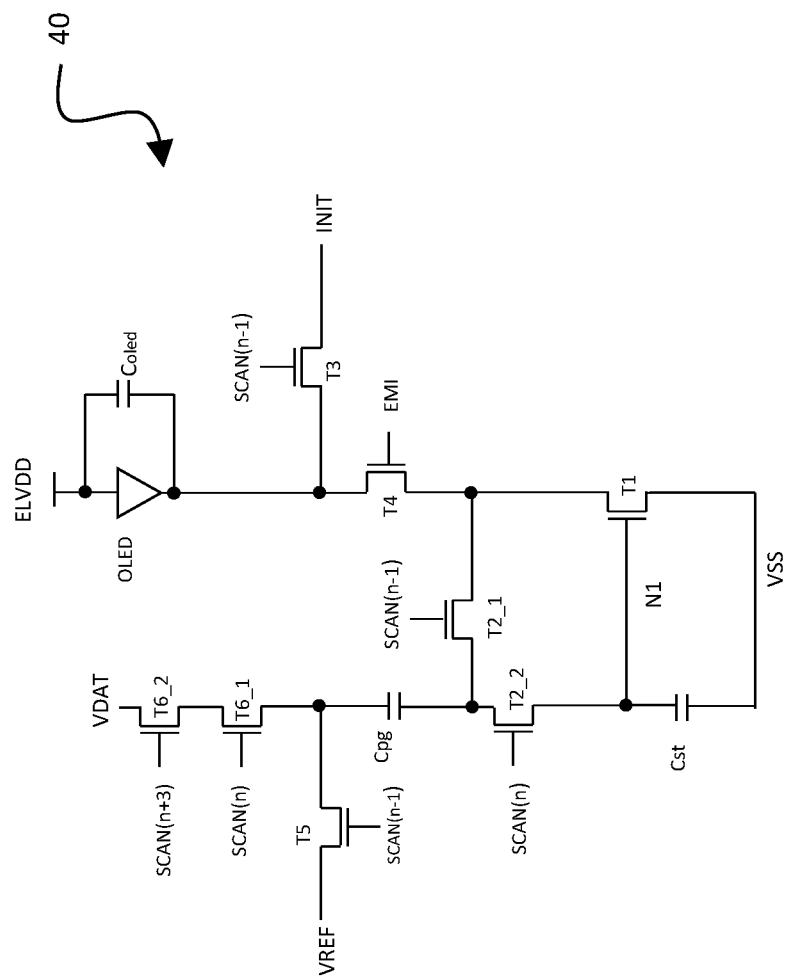
FIG. 7 is a drawing depicting a fifth circuit configuration in accordance with embodiments of the present invention.
Figure 8:
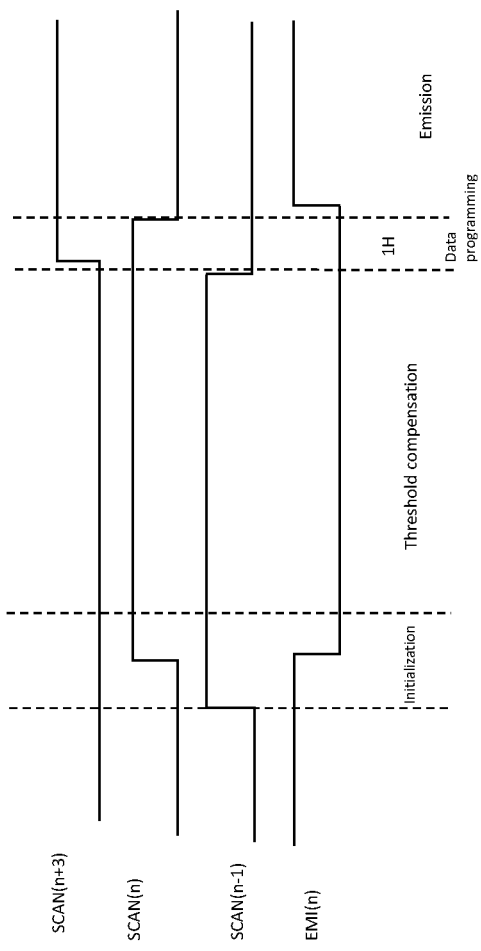
FIG. 8 is a drawing depicting a timing diagram associated with the operation of the circuit of FIG. 7.

FIG. 7 is a drawing depicting a fifth circuit configuration 40 in accordance with embodiments of the present invention, and FIG. 8 is a timing diagram associated with the operation of the circuit configuration 40 of FIG. 7. The circuit configuration 40 of FIG. 7 operates comparably as the circuit configuration 10 of FIG. 1, except that the circuit configuration 40 employs n-type transistors rather than p-type transistors. As is known in the art, the drive properties of an OLED may be more suitable for one or other of p-type versus n-type transistors, and the principles of the present invention are applicable to either type of configuration. Accordingly, in this example of FIG. 7, the circuit 40 is configured as a TFT circuit that includes multiple n-MOS or n-type TFTs, and two capacitors including a storage capacitor $C_{st}$ and a programming capacitor $C_{pg}$. The circuit elements drive a light-emitting device, such as for example an OLED. The light-emitting device (OLED) again has an associated internal capacitance, which again is represented in the circuit diagram as $C_{oled}$. The OLED further is connected to the first power supply ELVDD as is conventional. In addition, although the embodiments are described principally in connection with an OLED as the light-emitting device, comparable principles may be used with display technologies that employ other types of light-emitting devices, including for example micro LEDs and quantum dot LEDs.

Similarly as in the previous embodiments, T1 is a drive transistor that is an analogue TFT, and T2_1-T6_2 are digital switch TFTs. $C_{st}$ and $C_{pg}$ are capacitors, and $C_{oled}$ is the internal capacitance of the OLED device (i.e., $C_{oled}$ is not a separate component, but is inherent to the OLED). The OLED further is connected to a voltage supply ELVDD as is conventional.

In this embodiment, during the previous emission phase, the EMI(n) signal level has a high voltage value, so transistor T4 is on, and light emission is being driven by the input voltage VSS being connected to the drive transistor T1, whereby the actual current applied to the OLED is determined by the voltage at the gate of the drive transistor. The various SCAN signal levels initially have a low voltage value so transistors T2_1, T2_2, T3, T5, T6_1 and T6_2 are off. Next at the beginning of the initialization phase, the SCAN (n−1) signal level is changed from a low voltage value to a high voltage value, causing transistors T3, T2_1 and T5 to be turned on. With transistor T3 turning on, an initialization voltage, INIT, is applied at the cathode of the OLED. The INIT voltage is set to higher than the supply voltage ELVDD minus the threshold voltage of the OLED, and thus the INIT voltage does not cause light emission when applied at cathode of the OLED. With transistor T2_1 turning on, the initialization voltage, INIT, is also applied at the bottom plate of the capacitor, $C_{pg}$. With transistor T5 turning on, the reference voltage VREF is applied at the top plate of the capacitor, $C_{pg}$. The charge on the capacitor, $C_{pg}$, is initialized and reset.

Next during the initialization phase, the SCAN (n) signal level is changed from a low voltage value to a high voltage value, causing transistors T2_2 and T6_1 to be turned on. With transistor T2_2 turning on, the top plate of the storage capacitor, $C_{st}$, and thus also the gate of the drive transistor (node N1), is connected to the INIT voltage through transistors T3, T4, T2_1 and T2_2. The node N1 is initialized to the initialization voltage, INIT. Consequently, the drive transistor T1 is diode-connected through transistors T2_1 and T2_2 such that the drive transistor T1 is operated with its gate and a second terminal (e.g., source or drain) being electrically connected. The transistor T6_1 is turned on and ready for the data programming phase.

The TFT circuit 40 next is operable in a threshold compensation phase, during which the threshold voltage of the drive transistor T1 is compensated. For such phase, the EMI(n) signal level is changed from a high voltage value to a low voltage value, causing transistor T4 to be turned off. The drain and gate of the diode-connected transistor T1, the top plate of the capacitor, $C_{st}$, and the bottom plate of the storage capacitor, $C_{pg}$, thus are disconnected from the cathode of the OLED, thereby electrically isolating the OLED.

Preferably, to have effective threshold voltage compensation of the drive transistor T1, the voltage at the gate of the drive transistor should satisfy the following condition:

$$V_{N1}-V_{SS}>|V_{TH}|+\Delta V,$$

where $V_{N1}$ is the gate voltage of the drive transistor T1; $V_{TH}$ is the threshold voltage of the drive transistor T1, and $\Delta V$ is a voltage that is large enough to generate a high initial current to charge the storage capacitor within allocated threshold compensation time. The value of $\Delta V$ will depend on the properties of the transistors. For example, $\Delta V$ would be at least 3 volts for exemplary low-temperature polycrystalline silicon thin film transistor processes. The initial voltage, INIT, is set to satisfy the gate voltage, $V_{N1}$ requirement.

At the end of the threshold compensation phase, the SCAN (n−1) signal level is changed from the high voltage value to the low voltage value, causing transistors T2_1, T3 and T5 to be turned off. With T2_1 turning off, the drive transistor is no longer diode-connected. The voltage at the gate of the drive transistor is $V_{SS}+V_{TH}$. With T3 turning off, the INIT voltage is disconnected with the cathode of the OLED. With T5 tuning off, the reference voltage VREF is disconnected from the top plate of the capacitor, $C_{pg}$.

The TFT circuit 40 next is operable in a data programming phase. The SCAN (n+3) signal level is changed from the low voltage value to the high voltage value, causing transistor T6_2 to be turned on. The data signal thus is applied at the top plate of the data programming capacitor, $C_{pg}$. The data voltage, VDAT, is changed from the value for another pixel (e.g. the previous row of the display DATA (n−1)) to the data value for the current pixel (e.g. the current row of the display DATA(n)). Considering the parasitic capacitance is negligible, the VDAT is applied at the top plate of the capacitor, $C_{pg}$. The charge change at the bottom plate is $(V_{DAT}-V_{REF})C_{pg}$. The same amount charge change will appear at the bottom plate of the capacitor, $C_{pg}$, and thus the node N1. As both the capacitors, $C_{pg}$ and $C_{st}$, are connected at the node N1, the voltage change due the applied data voltage is $$\frac{C_{pg}}{C_{pg}+C_{st}}(V_{DAT}-V_{REF}).$$

Next the SCAN (n) signal level is changed from the high voltage value to the low voltage value, causing transistors T2_2 and T6_1 to be turned off. The capacitor, $C_{pg}$, is disconnected from node N1 and the data line, and any noise from the data line is isolated from the gate of the drive transistor. The gate voltage of the drive transistor is at the end of the data programming phase is $$V_{SS} + V_{TH} + \frac{C_{pg}}{C_{pg} + C_{st}}(V_{DAT} - V_{REF}).$$

Similarly as in the embodiment of FIG. 1, for the programming phase in the embodiment of FIG. 7, SCAN signals applied to different rows (e.g., SCAN(n) and SCAN (n+3)) are employed to electrically connect the data voltage VDAT to the top plate of the programming capacitor $C_{pg}$. By using SCAN signals from different rows in combination, a short programming pulse results from overlap of the SCAN signals, thereby minimizing the 1H time as shown in the timing diagram of FIG. 8. This embodiment has an advantage of using existing signal lines, but requires the two transistors T6_1 and T6_2 to electrically connect VDAT to the programming capacitor $C_{pg}$.

Similarly as in previous embodiments as and as illustrated in the timing diagram, the SCAN(n) signal is taken to a low voltage at the end of the programming phase, which turns off T2_2. At this time, SCAN(n-1) is also a low voltage, meaning T2_1 is also off. The result is that the programming capacitor $C_{pg}$ again is in a floating state whereby $C_{pg}$ is electrically isolated from the storage capacitor Cst, and in turn the drive transistor and the OLED for the subsequent emission phase. With such isolation of the programming capacitor from the storage capacitor and the other circuit elements, any noise from the data line is not coupled to the drive transistor and OLED. Once again, the programming and compensation phases are performed independent of each other, which provides for a shortened one horizontal time while maintaining accurate threshold compensation, and the isolation of the programming capacitor during the emission phase prevents any coupling of noise from the data line.

The TFT circuit 40 next is operable in an emission phase during which the OLED is capable of emitting light with the voltage input VSS being connected through T4. The EMI (n) signal is changed from the low voltage value to the high voltage value, causing transistor T4 to be turned on. With T4 turning one, the drain of the drive transistor is connected to the cathode of the OLED. The current that flows through the OLED is $$I_{OLED} = \frac{\beta}{2}\left(V_{SS} + V_{TH} + \frac{C_{pg}}{C_{pg} + C_{st}}(V_{DAT} - V_{REF}) - V_{SS} - V_{TH}\right)^2 =$$
$$\frac{\beta}{2}\left(\frac{C_{pg}(V_{DAT} - V_{REF})}{C_{pg} + C_{st}}\right)^2$$

where $\beta = \mu_n \cdot C_{ox} \cdot W/L$,
$C_{ox}$ is the capacitance of the drive transistor gate oxide;
W is the width of the drive transistor channel;
L is the length of the drive transistor channel (i.e. distance between source and drain);
$\mu_n$ is the carrier mobility of the drive transistor.

Accordingly, the current to the OLED does not depend on the threshold voltage of the drive transistor T1, and hence the current to the OLED device $I_{OLED}$ is not affected by the threshold voltage variations of the drive transistor. In this manner, variation in the threshold voltage of the drive transistor has been compensated.

Figure 9:
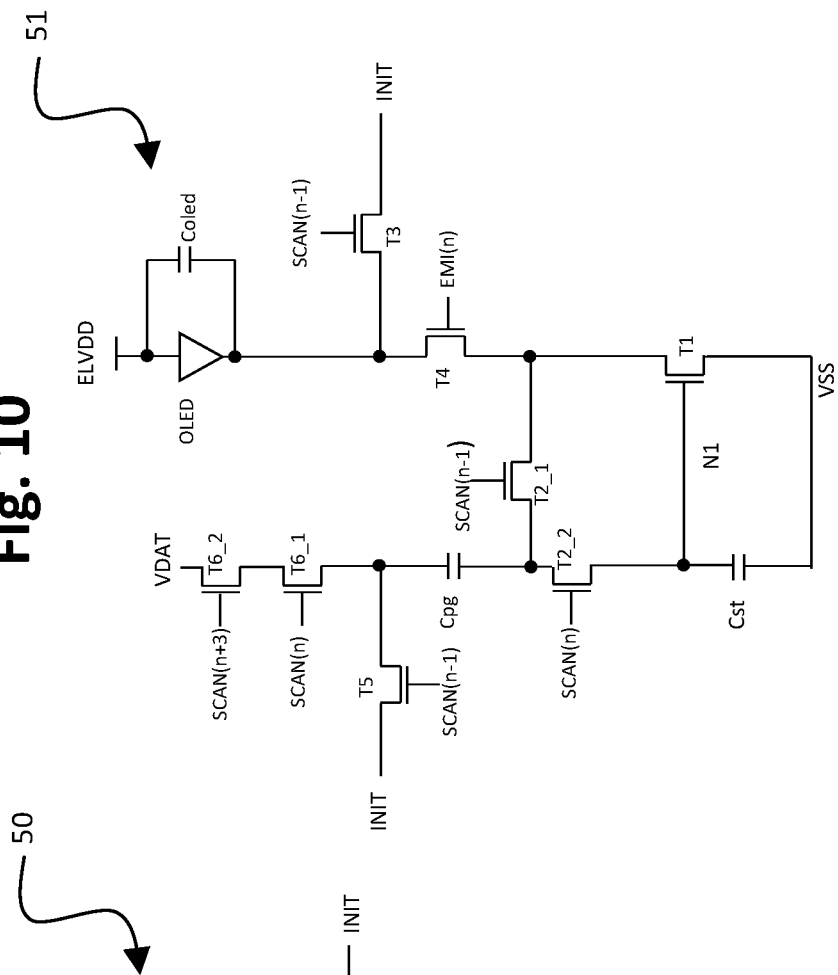
FIG. 9 is a drawing depicting a sixth circuit configuration in accordance with embodiments of the present invention.
Figure 10:
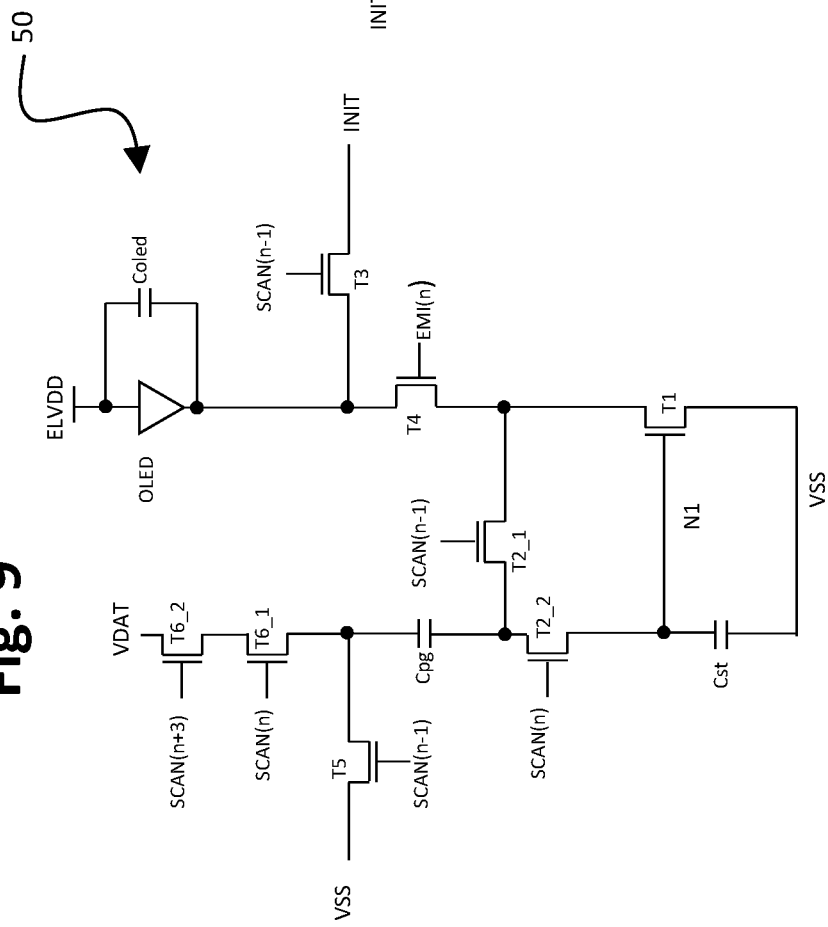
FIG. 10 is a drawing depicting a seventh circuit configuration in accordance with embodiments of the present invention.

FIG. 9 is a drawing depicting a sixth circuit configuration 50, and FIG. 10 is a drawing depicting a seventh circuit configuration 51, in accordance with embodiments of the present invention. The timing and the operation method of the circuit configurations 50 and 51 are essentially the same as the fifth circuit configuration 40, with the circuit configurations 50 and 51 varying as to a portion of the voltage supply inputs. In particular, the top plate of the programming capacitor, $C_{pg}$, is connected to an existing voltage supply, either supply voltage VSS in the circuit configuration 50 of FIG. 9, or the initialization voltage INIT in the circuit configuration 51 of FIG. 10, instead of a separate reference voltage, VREF as done in the circuit configuration 40 of FIG. 7. In the embodiments of FIGS. 9 and 10, therefore, an existing voltage input line supplies the reference voltage, or the reference voltage is the same as either VSS (FIG. 9) or INIT (FIG. 10). In this manner, the number of the input signal lines connected to the pixel circuit is reduced, and in turn the area of the pixel is reduced which is advantageous for high-definition displays. By comparison, an advantage of the circuit configuration 40 of FIG. 7, having an independent reference voltage input, is that within a defined or optimized data voltage range, the reference voltage can be selected as not being limited by an existing voltage supply.

For the circuit configuration 50 of FIG. 9, the current that flows through the OLED during emission phase is $$I_{OLED} = \frac{\beta}{2}\left(\frac{C_{pg}(V_{DAT} - V_{SS})}{C_{pg} + C_{st}}\right)^2.$$

For the circuit configuration 51, the current that flows through the OLED during emission phase is $$I_{OLED} = \frac{\beta}{2}\left(\frac{C_{pg}(V_{DAT} - V_{INIT})}{C_{pg} + C_{st}}\right)^2.$$

For the defined output current range, the data voltage, $V_{DAT}$, range has to be adjusted depending upon which voltage is utilized as the reference voltage—VSS, INIT, or an independent VREF.

Figure 11:
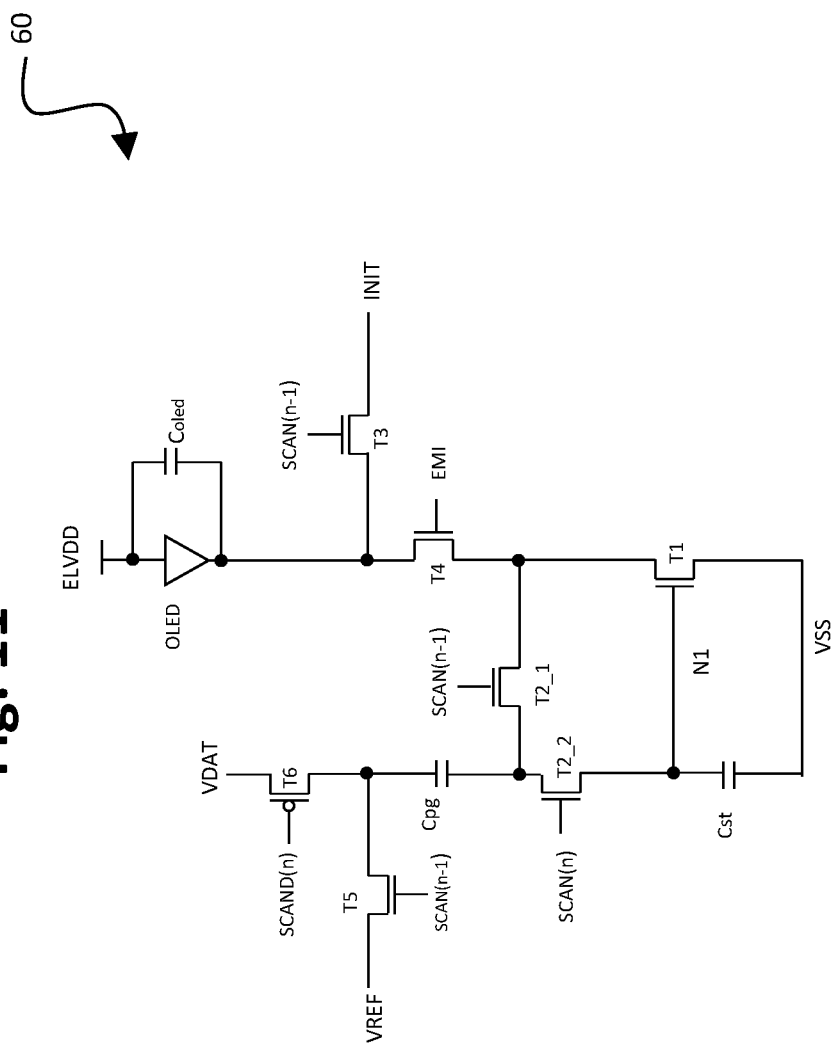
FIG. 11 is a drawing depicting an eighth circuit configuration in accordance with embodiments of the present invention.
Figure 12:
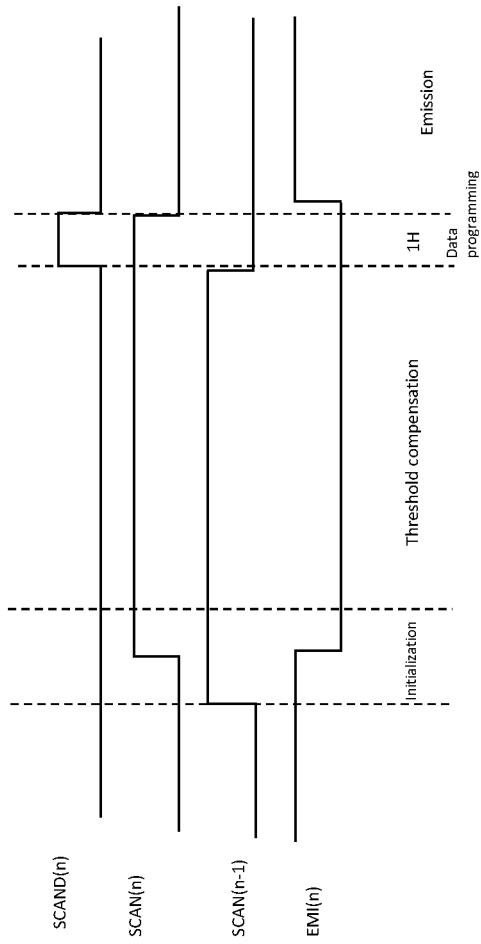
FIG. 12 is a drawing depicting a timing diagram associated with the operation of the circuit of FIG. 11.

FIG. 11 is a drawing depicting an eighth circuit configuration 60 in accordance with embodiments of the present invention, and FIG. 12 is a timing diagram associated with the operation of the circuit configuration 60 of FIG. 11. The circuit configuration 60 of FIG. 11 operates comparably as the circuit configuration 30 of FIG. 5, except that the circuit configuration 60 employs n-type transistors rather than p-type transistors. As referenced above, as is known in the art, the drive properties of an OLED may be more suitable for one or other of p-type versus n-type transistors, and the principles of the present invention are applicable to either type of configuration. Accordingly, in this example, the circuit 60 is configured as a TFT circuit that includes multiple n-type transistors (T1-T6). In this embodiment, there again are two capacitors, including the storage capacitor $C_{st}$ and the programming capacitor $C_{pg}$. The circuit elements drive a light-emitting device, such as for example an OLED. The light-emitting device (OLED) has an associated internal capacitance, which again is represented in the circuit diagram as $C_{oled}$. The OLED further is connected to the power supply ELVDD as is conventional. In addition, although the embodiments are described principally in connection with an OLED as the light-emitting device, comparable principles may be used with display technologies that employ other types of light-emitting devices, including for example micro LEDs and quantum dot LEDs.

Similarly as in the previous embodiments, T1 is a drive transistor that is an n-type analogue TFT, and transistors T2_1-T6 are n-type digital switch TFTs. As referenced above, $C_{st}$ and $C_{pg}$ are capacitors, and $C_{oled}$ is the internal capacitance of the OLED device.

Referring to the TFT circuit 60 of FIG. 11 in combination with the timing diagram of FIG. 12, the TFT circuit 60 also operates to perform in four phases: an initialization phase, a compensation phase, a data programming phase and an emission phase for light emission.

In this embodiment, during the previous emission phase, the EMI(n) signal level has a high voltage value, so transistor T4 is on, and light emission occurs by the connection of the input voltage VSS to the drive transistor T1, whereby the actual current to the OLED is determined by the voltage at the gate of the drive transistor. The various SCAN signal levels initially have a low voltage value so transistors T2_1, T2_2, T3, T5 and T6 are off. Next at the beginning of the initialization phase, the SCAN (n−1) signal level is changed from the low voltage value to the high voltage value, causing transistors T3, T2_1 and T5 to be turned on. With transistor T3 turning on, an initialization voltage, INIT, is applied at the cathode of the OLED. The INIT voltage is set to higher than the supply voltage ELVDD minus the threshold voltage of the OLED, and thus the INIT voltage won't cause light emission when applied at cathode of the OLED. With transistor T2_1 turning on, the initialization voltage, INIT, is also applied at the bottom plate of the capacitor, $C_{pg}$. With transistor T5 turning on, the reference voltage VREF is applied at the top plate of the capacitor, $C_{pg}$, and the charge on the capacitor, $C_{pg}$, is initialized and reset.

Next during the initialization phase, the SCAN (n) signal level is changed from a low voltage value to a high voltage value, causing transistor T2_2 to be turned on. With transistor T2_2 turning on, the top plate of the storage capacitor, $C_{st}$, and thus also the gate of the drive transistor (node N1), is connected to the INIT voltage through transistors T3, T4, T2_1 and T2_2. The node N1 is initialized to the initialization voltage, INIT. Consequently, the drive transistor T1 is diode-connected through transistors T2_1 and T2_2 such that the drive transistor is operated with its gate and a second terminal (e.g., source or drain) being electrically connected.

The TFT circuit 60 next is operable in a threshold compensation phase, during which the threshold voltage of the drive transistor T1 is compensated. For such phase, the EMI(n) signal level is changed from a high voltage value to a low voltage value, causing transistor T4 to be turned off. The drain and gate of the diode-connected transistor T1, the top plate of the storage capacitor, $C_{st}$, the bottom plate of the capacitor, $C_{pg}$, thus are disconnected from the cathode of the OLED, thereby electrically isolating the OLED.

Preferably, to have effective threshold voltage compensation of the drive transistor T1, the voltage at the gate of the drive transistor should satisfy the following condition:

$V_{N1} - V_{SS} > |V_{TH}| + \Delta V,$ where $V_{N1}$ is the gate voltage of the drive transistor T1; $V_{TH}$ is the threshold voltage of the drive transistor T1, and $\Delta V$ is a voltage that is large enough to generate a high initial current to charge the storage capacitor within an allocated threshold compensation time. The value of $\Delta V$ will depend on the properties of the transistors. For example, $\Delta V$ would be at least 3 volts for exemplary low-temperature polycrystalline silicon thin film transistor processes. The initial voltage, INIT, is set to satisfy the gate voltage, $V_{N1}$ requirement.

At the end of the threshold compensation phase, the SCAN (n−1) signal level is changed from the high voltage value to the low voltage value, causing transistors T2_1, T3 and T5 to be turned off. With T2_1 turning off, the drive transistor is no longer diode-connected. The voltage at the gate of the drive transistor is $V_{SS}+V_{TH}$. With T3 turning off, the INIT voltage is disconnected with the cathode of the OLED. With T5 tuning off, the reference voltage VREF is disconnected from the top plate of the capacitor, $C_{pg}$.

The TFT circuit 60 next is operable in a data programming phase. The SCAND (n) signal level is changed from the low voltage value to the high voltage value, causing transistor T6 to be turned on. The data signal thus is applied at the top plate of the data programming capacitor, $C_{pg}$. The data voltage, VDAT, is changed from the value for another pixel (e.g. the previous row of the display DATA(n−1)) to the data value for the current pixel (e.g. the current row of the display DATA(n)). Considering the parasitic capacitance is negligible, the VDAT is applied at the top plate of the capacitor, $C_{pg}$. The charge change at the top plate is $(V_{DAT}-V_{REF})C_{pg}$. The same amount charge change will appear at the bottom plate of the capacitor, $C_{pg}$, and thus the node N1. As both the capacitors, $C_{pg}$ and $C_{st}$, are connected at the node N1, the voltage change due the applied data voltage is $$\frac{C_{pg}}{C_{pg}+C_{st}}(V_{DAT}-V_{REF}).$$

Next the SCAND (n) signal level is changed from the high voltage value to the low voltage value, causing transistor T6 to be turned off. The capacitor, $C_{pg}$, is disconnected from the data line. Then the SCAN (n) signal level is changed from the high voltage value to the low voltage value, causing transistor T2_2 to be turned off. The capacitor, $C_{pg}$, is disconnected from node N1, and any noise from the data line is isolated from the gate of the drive transistor by transistors T6 and T2_2 being off. The gate voltage of the drive transistor is at the end of the data programming phase is $$V_{SS}+V_{TH}+\frac{C_{pg}}{C_{pg}+C_{st}}(V_{DAT}-V_{REF}).$$

The circuit configuration 60 of the embodiment of FIG. 11 differs from the circuit configuration 30 of the embodiment in FIG. 9 (and likewise the embodiment of FIG. 1) with respect to performance of the programming phase. For the programming phase in the circuit configuration 60, a dedicated signal line—SCAND—is applied at the gate of the transistor T6 to electrically connect the data voltage VDAT to the top plate of the programming capacitor $C_{pg}$. By using a dedicated SCAND signal line, a short pulse is readily achieved to minimize the one horizontal time 1H as shown in the timing diagram of FIG. 12, rather than relying on overlapping SCAN signals from different rows in combination as performed in the previous embodiment. The embodiment of FIG. 11 has an advantage of using only a single transistor (T6) to electrically connect VDAT to the programming capacitor $C_{pg}$, but requires the additional dedicated SCAND line to perform the programming phase.

Similarly as in previous embodiments as and as illustrated in the timing diagram, the SCAN(n) signal is taken to a low voltage at the end of the programming phase, which turns off T2_2. At this time, SCAN(n−1) is also a low voltage, meaning T2_1 is also off. The result is that the programming capacitor $C_{pg}$ again is in a floating state whereby $C_{pg}$ is electrically isolated from the storage capacitor Cst, and in turn the drive transistor and the OLED for the subsequent emission phase. With such isolation of the programming capacitor from the storage capacitor and the other circuit elements, any noise from the data line is not coupled to the drive transistor and OLED. Once again, the programming and compensation phases are performed independent of each other, which provides for a shortened one horizontal time while maintaining accurate threshold compensation, and the isolation of the programming capacitor during the emission phase prevents any coupling of noise from the data line.

The TFT circuit 60 next is operable in an emission phase during which the OLED is capable of emitting light with the voltage input VSS being connected to the OLED through T4. The EMI (n) signal is changed from the low voltage value to the high voltage value, causing transistor T4 to be turned on. The drain of the drive transistor is connected to the cathode of the OLED. The current flows through the OLED is $$I_{OLED} = \frac{\beta}{2}\left(V_{SS} + V_{TH} + \frac{C_{pg}}{C_{pg} + C_{st}}(V_{DAT} - V_{REF}) - V_{SS} - V_{TH}\right)^2 =$$
$$\frac{\beta}{2}\left(\frac{C_{pg}(V_{DAT} - V_{REF})}{C_{pg} + C_{st}}\right)^2$$

where $\beta = \mu_n \cdot C_{ox} \cdot W/L$,
$C_{ox}$ is the capacitance of the drive transistor gate oxide;
W is the width of the drive transistor channel;
L is the length of the drive transistor channel (i.e. distance between source and drain);
$\mu_n$ is the carrier mobility of the drive transistor.

Accordingly, the current to the OLED does not depend on the threshold voltage of the drive transistor T1, and hence the current to the OLED device $I_{OLED}$ is not affected by the threshold voltage variations of the drive transistor. In this manner, variation in the threshold voltage of the drive transistor has been compensated.

The pixel circuit configurations of the various embodiments are capable of compensating the threshold voltage variations of the drive transistor with an ultra-short one horizontal time (1H) of less than about 2 µs, which is shorter as compared to conventional configurations, with additionally removing the possible memory effects associated with the OLED device and drive transistor from the previous frame. The ultra-short 1H time (<2 µs) is achieved via the separation of threshold compensation of the drive transistor and data programming phases in the manner described above. The threshold compensation time is dictated by the drive transistor characteristics and is difficult to reduce further without degrading the compensation accuracy. By separating the threshold compensation and data programming phases, a longer time can be allocated to threshold compensation for compensation accuracy, while the programming phase is reduced to have an ultra-short 1H time (<2 µs). The described configurations also prevent data line noise from interfering with the voltage at the drive transistor gate during emission.

An aspect of the invention is a pixel circuit for a display device operable in a compensation phase, a data programming phase, and an emission phase, whereby the one horizontal time is minimized while maintaining accurate compensation of the threshold voltage of the drive transistor. In exemplary embodiments, the pixel circuit includes a drive transistor configured to control an amount of current to a light-emitting device during the emission phase depending upon a voltage input applied to a gate of the drive transistor; a second transistor and a third transistor, wherein the second transistor is connected between the gate of the drive transistor and the third transistor, and the third transistor is connected between the second transistor and a second terminal of the drive transistor, such that when the second and third transistors are in an on state the drive transistor becomes diode-connected such that the gate and the second terminal of the drive transistor are electrically connected through the second and third transistors, wherein a threshold voltage of the drive transistor is compensated during the compensation phase while the drive transistor is diode connected. The light-emitting device is electrically connected at a first node to the second terminal of the drive transistor during the emission phase and at a second node to a first voltage input. The pixel circuit further includes a storage capacitor having a first plate connected to a third terminal of the drive transistor that receives a second voltage input, and a second plate connected to the gate of the drive transistor, and a programming capacitor having a first plate connected to the second and third transistors, and a second plate of the programming capacitor is electrically connected to a data voltage input during the data programming phase, wherein the first plate of the programming capacitor is electrically connected to the second plate of the storage capacitor when the second transistor is in an on state. The second plate of the programming capacitor further is electrically connected to a reference voltage input to perform the compensation phase, and the programming capacitor further is electrically isolated from the storage capacitor and the drive transistor by the second and third transistors during the emission phase. The pixel circuit may include one or more of the following features, either individually or in combination.

In an exemplary embodiment of the pixel circuit, the pixel circuit further includes a fourth transistor connected between the first node of the light-emitting device and an initialization voltage input, wherein the pixel circuit further is operable in an initialization phase during which the initialization voltage is applied to the light emitting device and to the gate of the drive transistor while diode connected.

In an exemplary embodiment of the pixel circuit, the reference voltage input is the same as the initialization voltage input.

In an exemplary embodiment of the pixel circuit, the reference voltage input is the same as the second voltage input applied to the third terminal of the drive transistor.

In an exemplary embodiment of the pixel circuit, the pixel circuit further includes a fifth transistor that is connected between the second terminal of the drive transistor and the first node of the light-emitting device, wherein the light-emitting device is electrically connected to the drive transistor through the fifth transistor during the emission phase and electrically isolated from the drive transistor during the compensation and data programming phases.

In an exemplary embodiment of the pixel circuit, the pixel circuit further includes a sixth transistor that is connected between the reference voltage input and the second plate of the programming capacitor.

In an exemplary embodiment of the pixel circuit, the pixel circuit further includes a seventh transistor that connected between the second plate of the programming capacitor and the data voltage input.

In an exemplary embodiment of the pixel circuit, the pixel circuit further includes a seventh transistor and an eighth transistor, wherein the seventh transistor is connected between the second plate of the programming capacitor and the eighth transistor, and the eighth transistor is connected between the seventh transistor and the data voltage input.

In an exemplary embodiment of the pixel circuit, the pixel circuit further includes the light-emitting device, wherein the light-emitting device is electrically connected to the drive transistor during the emission phase and electrically isolated from the drive transistor during the compensation and data programming phases.

In an exemplary embodiment of the pixel circuit, the light-emitting device is one of an organic light-emitting diode, a micro light-emitting diode (LED), or a quantum dot LED.

In an exemplary embodiment of the pixel circuit, the transistors are p-type transistors.

In an exemplary embodiment of the pixel circuit, the transistors are n-type transistors.

Another aspect of the invention is a method of operating a pixel circuit according to any of the embodiments, whereby the one horizontal time is minimized while maintaining accurate compensation of the threshold voltage of the drive transistor. In exemplary embodiments, the method of operating includes the steps of providing a pixel circuit according to any of the embodiments; performing a compensation phase to compensate a threshold voltage of the drive transistor comprising diode-connecting the drive transistor through the second and third transistors and applying the reference voltage at the second plate of the programming capacitor while the drive transistor is diode connected, wherein the programming capacitor is isolated from the reference voltage at the end of the compensation phase; performing a data programming phase to program the data voltage to the programming capacitor comprising applying the data voltage at a second plate of the programming capacitor; and performing an emission phase during which light is emitted from the light-emitting device comprising isolating the programming capacitor from the storage capacitor and the drive transistor, and applying the second voltage input through the drive transistor to the light emitting device. The method of operating may include one or more of the following features, either individually or in combination.

In an exemplary embodiment of the method of operating, the programming phase follows the threshold compensation phase.

In an exemplary embodiment of the method of operating, a duration of the data programming phase is shorter than a duration of the compensation phase.

In an exemplary embodiment of the method of operating, the method further includes performing an initialization phase comprising, prior to the compensation and data programming phases, applying an initialization voltage to a first node of the light emitting device and to the gate of the drive transistor via the diode-connection through the second and third transistors.

In an exemplary embodiment of the method of operating, the reference voltage is the initialization voltage.

In an exemplary embodiment of the method of operating, the reference voltage is the second voltage input applied to the third terminal of the drive transistor.

In an exemplary embodiment of the method of operating, the pixel circuit comprises two transistors connected between the data voltage input and the second plate of the programming capacitor, wherein during the data programming phase, SCAN signals from different rows of pixels respectively are applied to gates of the two transistors to apply the data voltage at the second plate of the programming capacitor.

In an exemplary embodiment of the method of operating, the pixel circuit comprises a single transistor connected between the data voltage input and the second plate of the programming capacitor, wherein during the data programming phase, a dedicated SCAN signal is applied to a gate of the single transistor to apply the data voltage at the second plate of the programming capacitor.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

Embodiments of the present invention are applicable to many display devices to permit display devices of high resolution with effective threshold voltage compensation and true black performance. Examples of such devices include televisions, mobile phones, personal digital assistants (PDAs), tablet and laptop computers, desktop monitors, digital cameras, and like devices for which a high resolution display is desirable.

REFERENCE SIGNS LIST

10—first circuit configuration
20—second circuit configuration
21—third circuit configuration
30—fourth circuit configuration
40—fifth circuit configuration
50—sixth circuit configuration
51—seventh circuit configuration
60—eighth circuit configuration
T1-T6_2—multiple transistors
OLED—organic light emitting diode (or generally light-emitting device)
$C_{st}$—storage capacitor
$C_{pg}$— programming capacitor
$C_{oled}$—internal capacitance of OLED
N1—Node at drive transistor
VDAT—data voltage
VDD—power supply
VSS—power supply
ELVSS—power supply
ELVDD—power supply
VREF—reference voltage supply
INIT—initialization voltage supply
SCAN/EMI/SCAND—control signals

What is claimed is:

1. A pixel circuit for a display device operable in a compensation phase, a data programming phase, and an emission phase, the pixel circuit comprising:
   a drive transistor configured to control an amount of current to a light-emitting device during the emission phase depending upon a voltage input applied to a gate of the drive transistor;
   a second transistor and a third transistor, wherein the second transistor is directly connected between the gate of the drive transistor and the third transistor, and the third transistor is directly connected between the second transistor and a second terminal of the drive transistor, such that when the second and third transistors are in an on state the drive transistor becomes diode-connected such that the gate and the second terminal of the drive transistor are electrically connected through the second and third transistors, wherein a threshold voltage of the drive transistor is compensated during the compensation phase while the drive transistor is diode connected;
   wherein the light-emitting device is electrically connected at a first node to the second terminal of the drive transistor during the emission phase and at a second node to a first voltage input;
   a storage capacitor having a first plate connected to a third terminal of the drive transistor that receives a second voltage input, and a second plate connected to the gate of the drive transistor, and
   a programming capacitor having a first plate directly connected to the second and third transistors, and a second plate of the programming capacitor is electrically connected to a data voltage input during the data programming phase, wherein the first plate of the programming capacitor is electrically connected to the second plate of the storage capacitor when the second transistor is in an on state;
   wherein the second plate of the programming capacitor further is electrically connected to a reference voltage input to perform the compensation phase, and the programming capacitor further is electrically isolated from the storage capacitor and the drive transistor by the second and third transistors during the emission phase.

2. The pixel circuit of claim 1, further comprising a fourth transistor connected between the first node of the light-emitting device and an initialization voltage input, wherein the pixel circuit further is operable in an initialization phase during which the initialization voltage is applied to the light emitting device and to the gate of the drive transistor while diode connected.

3. The pixel circuit of claim 2, wherein the reference voltage input is the same as the initialization voltage input.

4. The pixel circuit of claim 1, wherein the reference voltage input is the same as the second voltage input applied to the third terminal of the drive transistor.

5. The pixel circuit of claim 1, further comprising a fifth transistor that is connected between the second terminal of the drive transistor and the first node of the light-emitting device, wherein the light-emitting device is electrically connected to the drive transistor through the fifth transistor during the emission phase and electrically isolated from the drive transistor during the compensation and data programming phases.

6. The pixel circuit of claim 1, further comprising a sixth transistor that is connected between the reference voltage input and the second plate of the programming capacitor.

7. The pixel circuit of claim 1, further comprising a seventh transistor that connected between the second plate of the programming capacitor and the data voltage input.

8. The pixel circuit of claim 1, further comprising a seventh transistor and an eighth transistor, wherein the seventh transistor is connected between the second plate of the programming capacitor and the eighth transistor, and the eighth transistor is connected between the seventh transistor and the data voltage input.

9. The pixel circuit of claim 7, further comprising the light-emitting device, wherein the light-emitting device is electrically connected to the drive transistor during the emission phase and electrically isolated from the drive transistor during the compensation and data programming phases.

10. The pixel circuit of claim 1, wherein the light-emitting device is one of an organic light-emitting diode, a micro light-emitting diode (LED), or a quantum dot LED.

11. The pixel circuit of claim 1, wherein the transistors are p-type transistors.

12. The pixel circuit of claim 1, wherein the transistors are n-type transistors.

13. A method of operating a pixel circuit for a display device comprising the steps of:
   providing a pixel circuit comprising:
      a drive transistor configured to control an amount of current to a light-emitting device during the emission phase depending upon a voltage input applied to a gate of the drive transistor;
      a second transistor and a third transistor, wherein the second transistor is connected between the gate of the drive transistor and the third transistor, and the third transistor is connected between the second transistor and a second terminal of the drive transistor, such that when the second and third transistors are in an on state the drive transistor becomes diode-connected such that the gate and the second terminal of the drive transistor are electrically connected through the second and third transistors;
      a storage capacitor having a first plate connected to a third terminal of the drive transistor that receives a second voltage input, and a second plate connected to the gate of the drive transistor, and
      a programming capacitor having a first plate connected to the second and third transistors, and a second plate of the programming capacitor is electrically connectable to a data voltage input;
   performing a compensation phase to compensate a threshold voltage of the drive transistor comprising diode-connecting the drive transistor through the second and third transistors and applying the reference voltage at the second plate of the programming capacitor while the drive transistor is diode connected, wherein the programming capacitor is isolated from the reference voltage at the end of the compensation phase;
   performing a data programming phase to program the data voltage to the programming capacitor comprising applying the data voltage at a second plate of the programming capacitor while the second transistor is in an on state; and
   performing an emission phase during which light is emitted from the light-emitting device comprising isolating the programming capacitor from the storage capacitor and the drive transistor, and applying the second voltage input through the drive transistor to the light emitting device.

14. The method of operating of claim 13, wherein the programming phase follows the threshold compensation phase.

15. The method of operating of claim 13, wherein a duration of the data programming phase is shorter than a duration of the compensation phase.

16. The method of operating of claim 13, further comprising performing an initialization phase comprising, prior to the compensation and data programming phases, applying an initialization voltage to a first node of the light emitting device and to the gate of the drive transistor via the diode-connection through the second and third transistors.

17. The method of operating of claim 16, wherein the reference voltage is the initialization voltage.

18. The method operating of claim 13, wherein the reference voltage is the second voltage input applied to the third terminal of the drive transistor.

19. The method of operating of claim 13, wherein the pixel circuit comprises two transistors connected between the data voltage input and the second plate of the programming capacitor, wherein during the data programming phase, SCAN signals from different rows of pixels respectively are applied to gates of the two transistors to apply the data voltage at the second plate of the programming capacitor.

20. The method of operating of claim 13, wherein the pixel circuit comprises a single transistor connected between the data voltage input and the second plate of the programming capacitor, wherein during the data programming phase, a dedicated SCAN signal is applied to a gate of the single transistor to apply the data voltage at the second plate of the programming capacitor.

* * * * *